(12) United States Patent
Mitsui

(10) Patent No.: US 8,807,835 B2
(45) Date of Patent: Aug. 19, 2014

(54) SLIDE UNIT MECHANISM

(75) Inventor: Yasuhiro Mitsui, Chiba (JP)

(73) Assignee: Mitsubishi Steel Mfg. Co., Ltd., Tokyo (JP)

( * ) Notice: Subject to any disclaimer, the term of this patent is extended or adjusted under 35 U.S.C. 154(b) by 36 days.

(21) Appl. No.: 13/701,901

(22) PCT Filed: Jun. 2, 2011

(86) PCT No.: PCT/JP2011/062689
§ 371 (c)(1),
(2), (4) Date: Dec. 4, 2012

(87) PCT Pub. No.: WO2011/155384
PCT Pub. Date: Dec. 15, 2011

(65) Prior Publication Data
US 2013/0077903 A1 Mar. 28, 2013

(30) Foreign Application Priority Data
Jun. 7, 2010 (JP) .................. 2010-129706

(51) Int. Cl.
F16C 29/00 (2006.01)
F16C 29/06 (2006.01)
A47B 88/00 (2006.01)
H04W 24/00 (2009.01)
H05K 5/02 (2006.01)
H04M 1/02 (2006.01)
G06F 1/16 (2006.01)

(52) U.S. Cl.
CPC .......... H05K 5/0217 (2013.01); H04M 1/0237 (2013.01); G06F 1/1624 (2013.01); G06F 1/1679 (2013.01)

USPC ............................ 384/10; 384/21; 455/575.4

(58) Field of Classification Search
USPC ............ 384/7, 10, 21, 22; 74/527; 455/575.4
See application file for complete search history.

(56) References Cited

U.S. PATENT DOCUMENTS 7,853,301 B2 * 12/2010 Kim et al. ................. 455/575.4
2006/0046783 A1 3/2006 Bae
(Continued)

FOREIGN PATENT DOCUMENTS

JP 2007-267238 10/2007
JP 2008-196525 8/2008
(Continued)

OTHER PUBLICATIONS

International Search Report mailed on Jul. 26, 2011.
(Continued)

Primary Examiner — James Pilkington
(74) Attorney, Agent, or Firm — IPUSA, PLLC

(57) ABSTRACT

A slide unit mechanism includes a sliding plate including slide parts and rattle preventing mechanisms that engage the sliding plate to prevent the sliding plate from rattling. Each of the rattle preventing mechanisms includes a recess; an opening positioned on a moving path of the slide part; a locking torsion spring disposed in the recess, one end of which is attached to an engaging part protruding from the opening on the moving path of the slide part; and an engaging recess formed in the slide part and configured to engage the engaging part. When the sliding plate is slid to the open position or the closed position, the engaging part engages the engaging recess and is biased by elastic force of the locking torsion spring toward the engaging recess.

2 Claims, 9 Drawing Sheets

(56) References Cited

U.S. PATENT DOCUMENTS

2008/0194304 A1    8/2008   Satoshi et al.
2009/0029749 A1*   1/2009   Lee .......................... 455/575.4
2009/0247248 A1   10/2009   Ito
2009/0279234 A1   11/2009   Lee
2009/0305754 A1   12/2009   Yuan
2010/0226080 A1    9/2010   Tsuchida et al.
2011/0244923 A1*  10/2011   Shen ............................ 384/26

FOREIGN PATENT DOCUMENTS

JP    2008-535438      8/2008
JP        3155691     11/2009
WO   WO 2009/054546    4/2009

OTHER PUBLICATIONS

Extended European Search Report dated Dec. 4, 2013.

* cited by examiner

SLIDE UNIT MECHANISM

TECHNICAL FIELD

The present invention generally relates to a slide unit mechanism. More particularly, the present invention relates to a thin slide unit mechanism used in an electronic apparatus.

BACKGROUND ART

A known "slidable" electronic apparatus includes a first housing used for a monitor unit, a second housing used as a main unit, and a torsion spring one end of which is fixed to the first housing and another end of which is fixed to the second housing. With the spring pressure of the torsion spring, the first housing and the second housing are slidable relative to each other.

In these years, cell phones that can receive one-segment broadcasting have become popular. Such a cell phone typically includes a wide monitor placed in a housing which is slidable in a lateral direction by means of a sliding plate. For example, Patent document 1 discloses a portable electronic device including a sliding plate that is slidable in the lateral direction.

RELATED-ART DOCUMENTS

Patent Document

[Patent document 1] Japanese Laid-Open Patent Publication No. 2007-267238

DISCLOSURE OF INVENTION

Problems to be Solved by the Invention

The portable electronic device disclosed in patent document 1, which includes a sliding plate slidable in the lateral direction, also uses a torsion spring. Since such a torsion spring needs to have relatively large spring force, the torsion spring may occupy a space that is longer than or equal to one half of the slide length (or stroke length). This in turn makes it necessary to increase the area of a plate for hiding the sliding mechanism. Also, because it is necessary to make the plate invisible from the outside of the portable electronic apparatus, the slide length is limited and as a result, the area of a lower layer part (operation unit), which is exposed by sliding an upper layer part (monitor unit), is also limited. This in turn limits the size and layout of operation buttons.

Further, in a portable electronic apparatus where a slide plate is slid in the lateral direction, the slide length inevitably becomes short. To increase the slide length, it is necessary to reduce the width of a sliding plate in the sliding direction. However, when the width of a sliding plate in the sliding direction is reduced, the width of a part of the sliding plate that engages a guide part for guiding the sliding plate is also reduced, and as a result, the sliding plate rattles when being slid.

One object of the present invention is to reduce or solve one or more of the above problems and to provide a slide unit mechanism that makes it possible to reduce the area of an internal sliding structure that is visible from the outside and to prevent a sliding plate from rattling.

Means for Solving the Problems

In an aspect of this disclosure, there is provided a slide unit mechanism that includes a quadrangular first fixed plate including a protrusion formed in the middle of its back surface along a sliding direction and recesses formed on both sides of the protrusion; a sliding plate configured to slide on the first fixed plate between an open position and a closed position, the sliding plate including slide parts that slidably engage edges of the first fixed plate and a connecting part that connects the slide parts on a front surface of the first fixed plate; a second fixed plate having a size greater than the first fixed plate, wherein the first fixed plate with the sliding plate is attached to the second fixed plate; sliding springs disposed in the recesses and between the first fixed plate and the second fixed plate, first ends of the sliding springs being held at positions substantially in a middle of the first fixed plate in the sliding direction and second ends of the sliding springs being held by the slide parts; and rattle preventing mechanisms configured to engage the sliding plate when the sliding plate is slid to at least one of the open position and the closed position to thereby prevent the sliding plate from rattling. Each of the rattle preventing mechanisms includes a recess formed in a back surface of the second fixed plate at a position corresponding to one of the open position and the closed position of the sliding plate, an opening that passes through the second fixed plate from the recess to a front surface of the second fixed plate and is positioned on a moving path of one of the slide parts, a locking torsion spring disposed in the recess, one end of the locking torsion spring engaging the second fixed plate and another end of the locking torsion spring being attached to an engaging part that protrudes from the opening on the moving path of the one of the slide parts, and an engaging recess formed in the one of the slide parts and configured to engage the engaging part. The engaging part is configured to engage the engaging recess and to be biased by elastic force of the locking torsion spring toward the engaging recess when the sliding plate is slid to the open position or the closed position.

Advantageous Effect of the Invention

An aspect of this disclosure provides a slide unit mechanism that makes it possible to reduce the area of an internal sliding structure that is visible from the outside and to prevent a sliding plate from rattling.

DESCRIPTION OF EMBODIMENTS

Figure 1A:
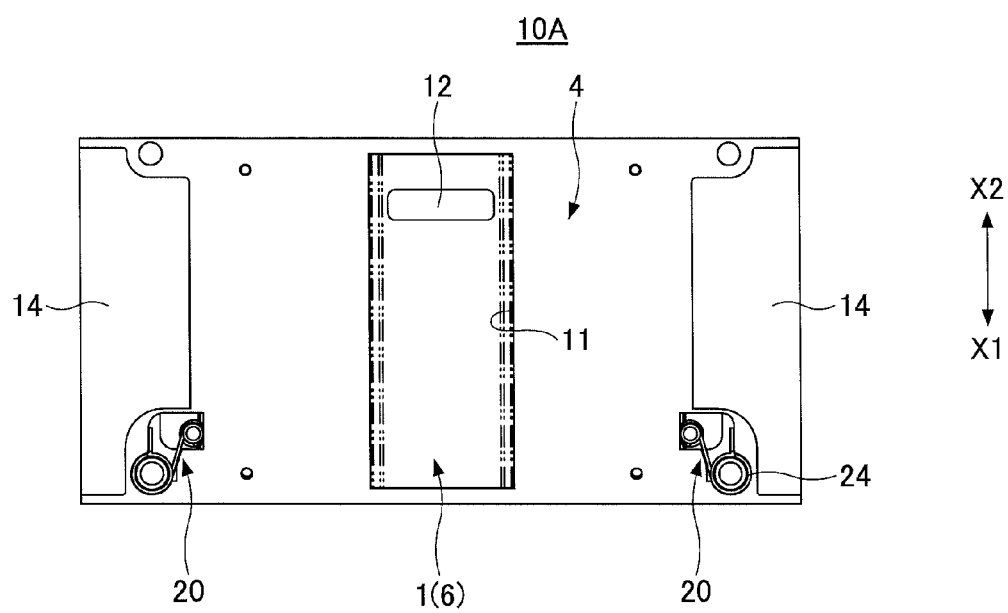
FIG. 1A is a back view of a slide unit mechanism according to a first embodiment.
Figure 1B:
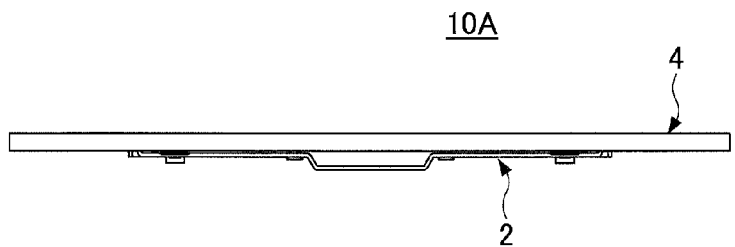
FIG. 1B is a side view of a slide unit mechanism according to the first embodiment.
Figure 1C:
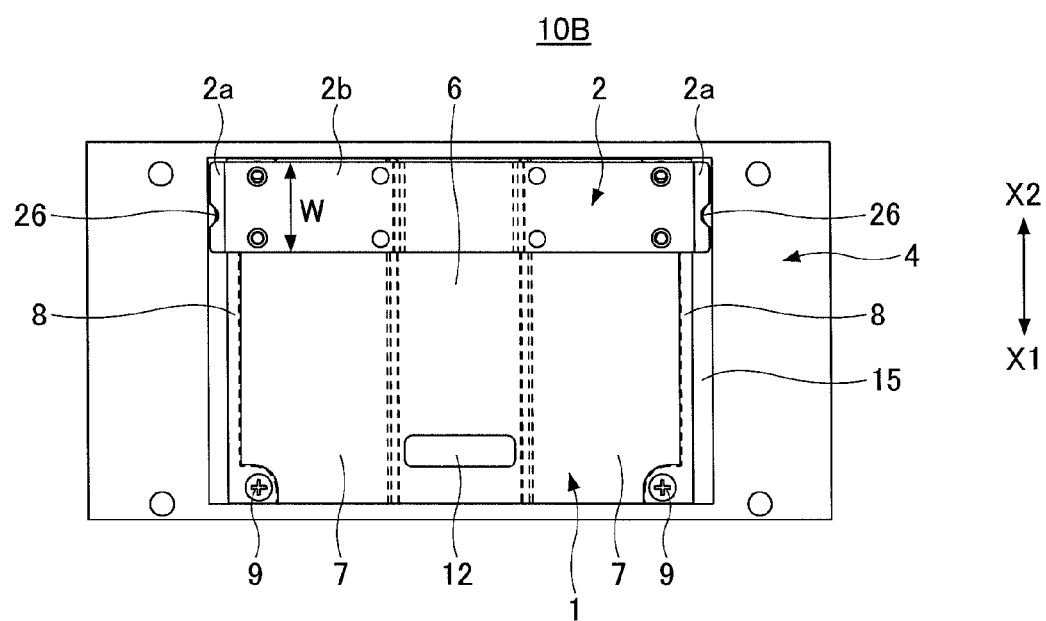
FIG. 1C is a front view of a slide unit mechanism according to the first embodiment.
Figure 2:
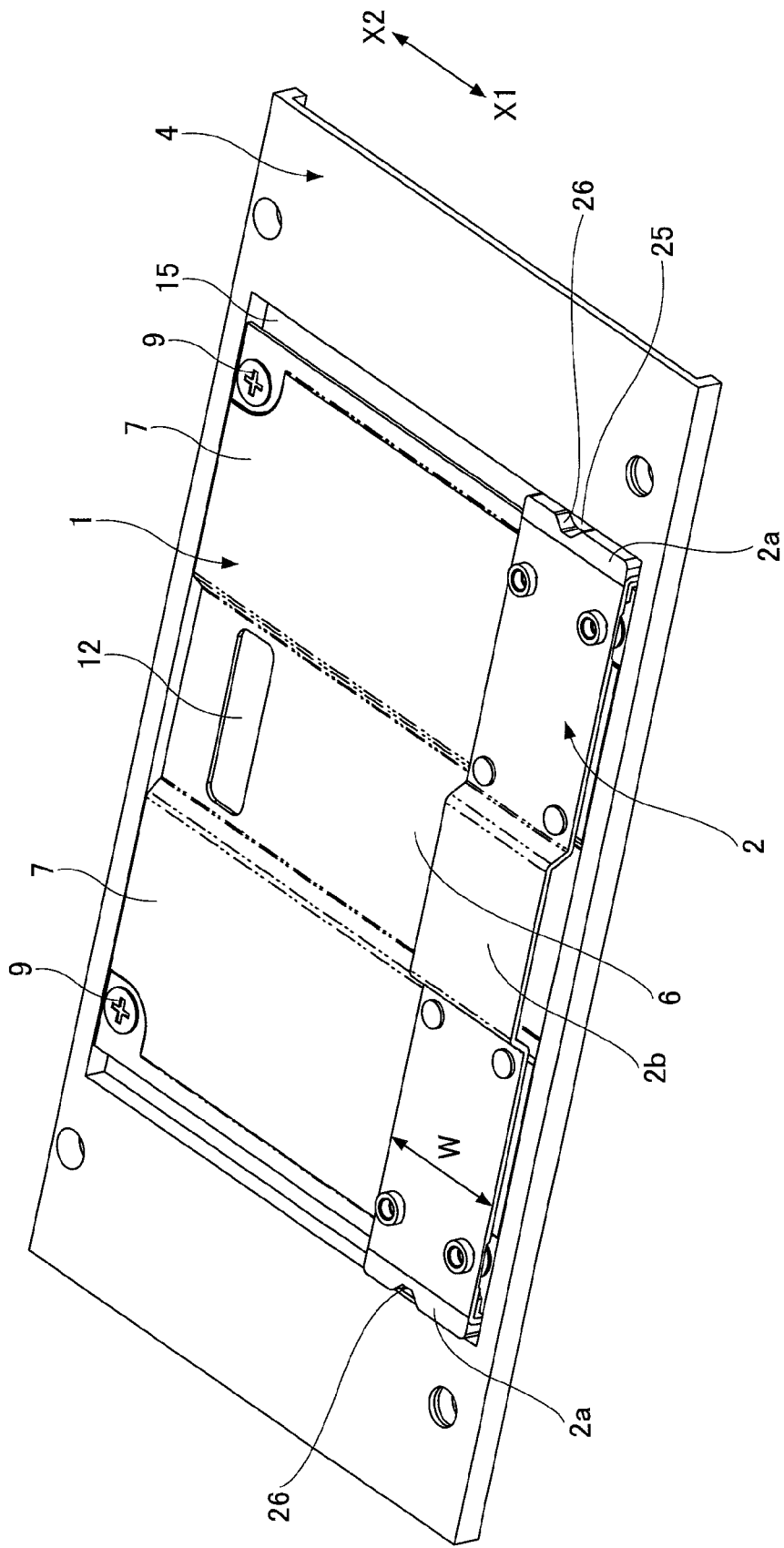
FIG. 2 is a front perspective view of a slide unit mechanism according to the first embodiment.
Figure 3:
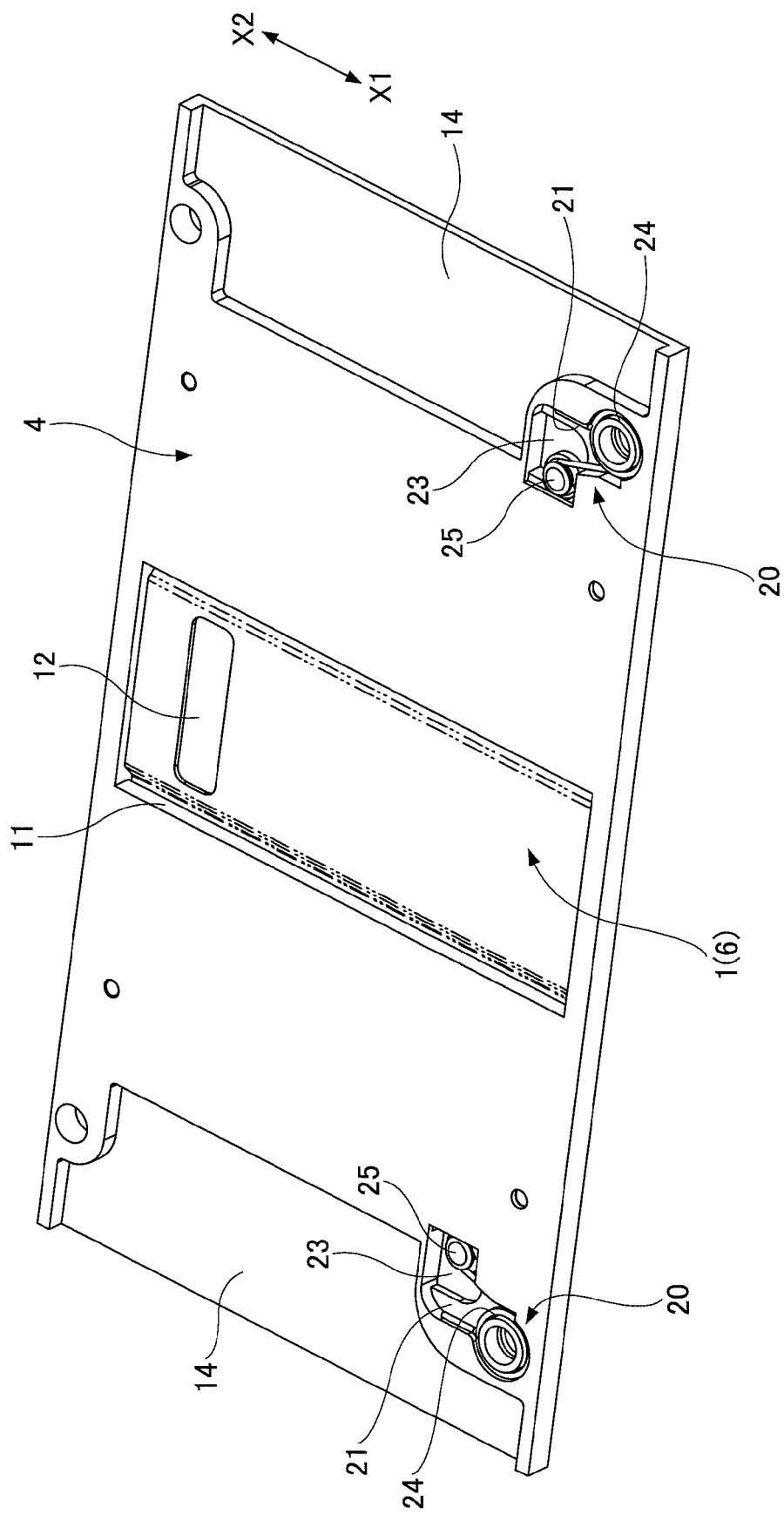
FIG. 3 is a back perspective view of a slide unit mechanism according to the first embodiment.
Figure 4:
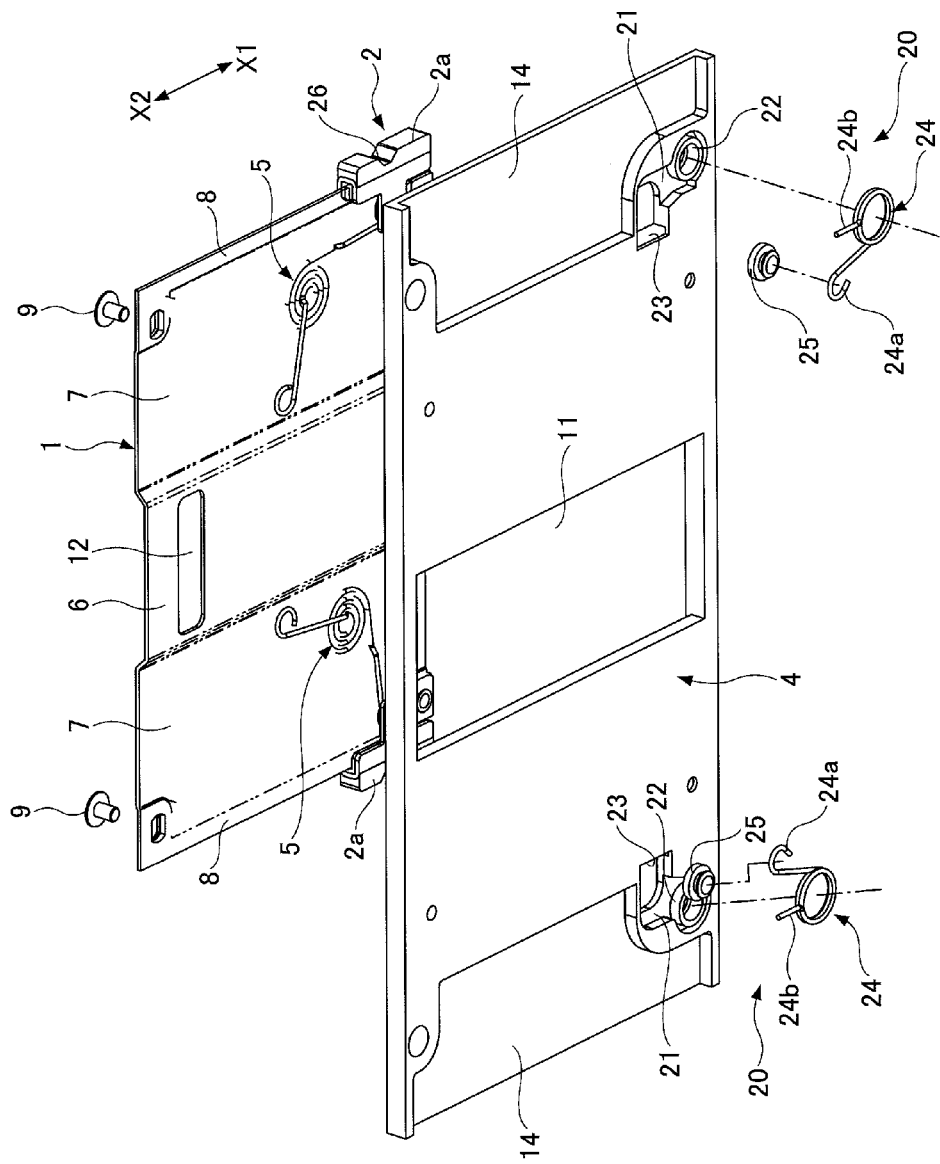
FIG. 4 is an exploded perspective view of a slide unit mechanism according to the first embodiment.

Preferred embodiments of the present invention are described below with reference to the accompanying drawings.

FIGS. 1 through 4 are drawings used to describe a slide unit mechanism 10A according to a first embodiment. The slide unit mechanism 10A of the present embodiment includes a first fixed plate 1, a sliding plate 2, a second fixed plate 4, sliding torsion springs 5, and rattle preventing mechanisms 20.

The slide unit mechanism 10A may be used, for example, for a portable electronic apparatus including an upper housing (monitor unit) that is slidable in the lateral direction relative to a lower housing (operation unit). The first and second fixed plates 1 and 4 are attached to a lower housing (not shown), and the sliding plate 2 is attached to an upper housing (not shown).

In the slide unit mechanism 10A of the present embodiment, the sliding plate 2 slides relative to the first and second fixed plates 1 and 4 in the lateral direction (directions indicated by arrows X1 an X2) of the first and second fixed plates 1 and 4. With this configuration, the upper housing slides relative to the lower housing between an open position and a closed position. In the descriptions below, it is assumed that the closed position indicates a position up to which the sliding plate 2 can slide in the X1 direction, and the open position indicates a position up to which the sliding plate 2 can slide in the X2 direction.

In the slide unit mechanism 10A illustrated in FIGS. 1 through 4, the sliding plate 2 is at the closed position. Both the first fixed plate 1 and the sliding plate 2 have rectangular shapes (or quadrangular shapes in plan view). The area of the second fixed plate 4 is greater than the area of the first fixed plate 1 in front view.

A protrusion 6 extending in the sliding direction (X1 and X2 directions) is formed in substantially the middle of the back surface of the first fixed plate 1. On both sides of the protrusion 6 of the first fixed plate 1, recesses 7 are formed (see FIG. 5).

The sliding plate 2 is slidably attached to the first fixed plate 1. The sliding plate 2 includes slide parts 2a that slidably engage edge parts 8 located at the ends in the lateral direction of the first fixed plate 1 and a connecting part 2b that connects the slide parts 2a on the front surface (the side illustrated in FIGS. 1C and 2) of the first fixed plate 1.

The slide parts 2a are folded backward from the connecting part 2b disposed on the front surface of the first fixed plate 1 and engage the edge parts 8 of the first fixed plate 1. Middle portions of the folded slide parts 2a further extend inward to form stoppers 3. The slide parts 2a are made of resin, and the connecting part 2b is made of metal. The slide parts 2a are formed by insert molding and are thereby combined with the connecting part 2b.

The sliding plate 2 configured as described above slides on the first fixed plate 1 between the open position and the closed position. As described above, the slide unit mechanism 10A of the present embodiment is configured such that the sliding plate 2 slides in the lateral direction of the first and second fixed plates 1 and 4. To increase the stroke length of the sliding plate 2, the width (indicated by W in FIGS. 1C and 2) of the sliding plate 2 is set as short as possible but not to reduce the strength of the sliding plate 2.

With the sliding plate 2 attached, the first fixed plate 1 is attached to the second fixed plate 4 such that the sliding plate 2 is still slidable. A rectangular opening 11 is formed in the middle of the second fixed plate 4 to accommodate the protrusion 6 of the first fixed plate 1. Also, a mounting recess 15, where the first fixed plate 1 is to be placed, is formed in the front surface of the second fixed plate 4 and thin parts 14 are formed in the back surface of the second fixed plate 4.

Forming the thin parts 14 and the mounting recess 15 makes it possible to reduce the weight of the second fixed plate 4 that has a relatively large size. Also, it is possible to reduce the thickness of the slide unit mechanism 10A by placing the first fixed plate 1 in the mounting recess 15 of the second fixed plate 4.

Figure 5:
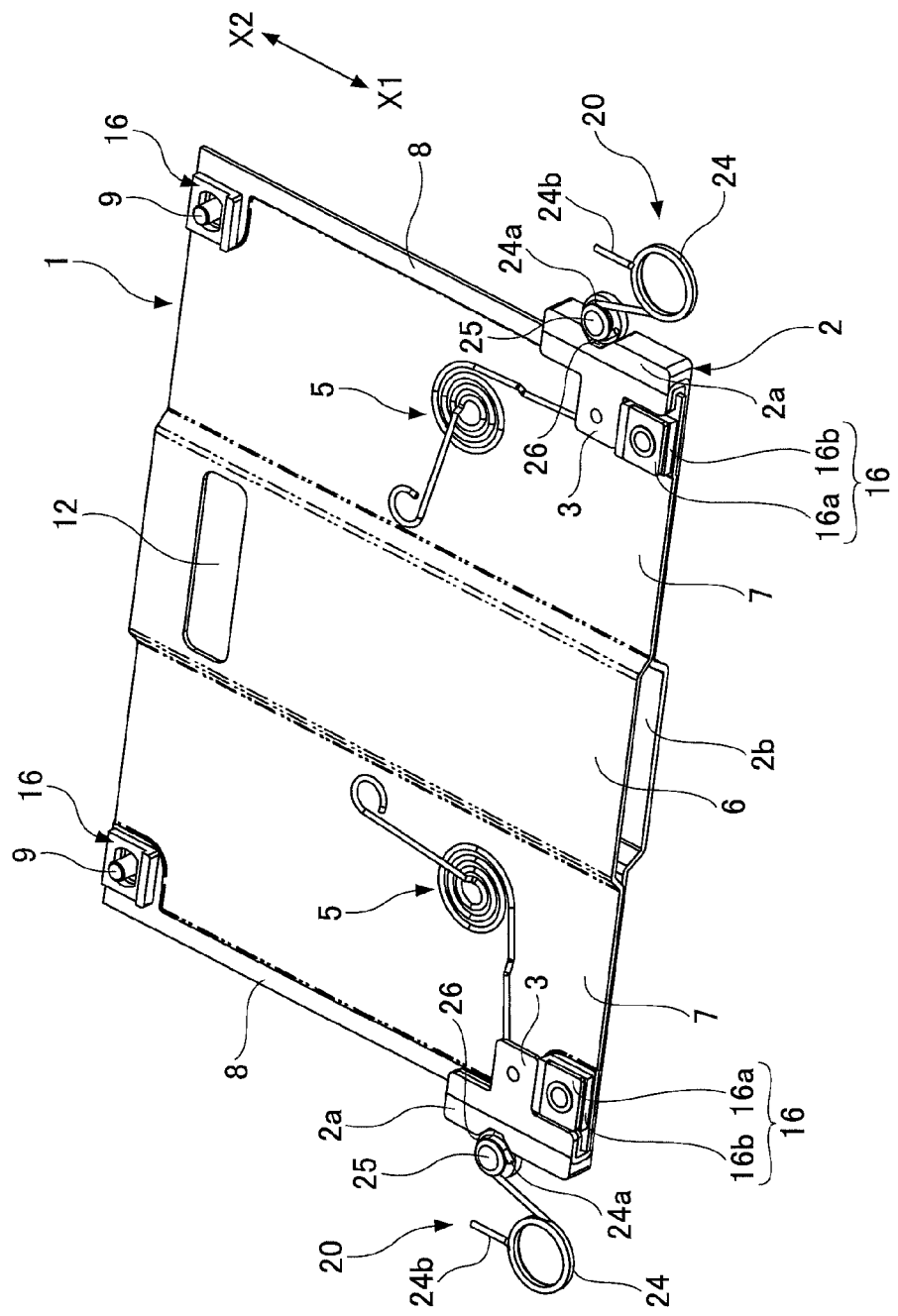
FIG. 5 is a perspective view of a first fixed plate of a slide unit mechanism according to the first embodiment.

The first fixed plate 1 is fixed to the second fixed plate 4 with screws 9. Stoppers 16 are provided at four corners of the first fixed plate 1. As illustrated in FIG. 5, each of the stoppers 16 includes a metal plate 16a and a stopper rubber 16b that are stacked. As described above, the sliding plate 2 slides between the closed position and the open position. As illustrated in FIG. 5, the stoppers 3 contact the stopper rubbers 16b of the stoppers 16 at the X1 end when the sliding plate 2 is at the closed position, and contact the stopper rubbers 16b of the stoppers 16 at the X2 end when the sliding plate 2 is at the open position. This configuration prevents the sliding plate 2 from sliding over the closed position and the open position.

The sliding torsion springs 5 (which correspond to "sliding springs" in claims) are disposed in the recesses 7 formed on the right and left sides of the first fixed plate 1. One end of each of the sliding torsion springs 5 is held by a boss (not shown) formed substantially in the middle of the second fixed plate 4 in the sliding direction. The other end of the sliding torsion spring 5 is held by the stopper 3 of the slide part 2a.

The winding part of the sliding torsion spring 5 is wound horizontally and has a flat shape. Using the sliding torsion spring 5 with the flat winding part instead of a torsion spring with a vertically-wound winding part makes it possible to reduce the thickness of the slide unit mechanism 10A.

As illustrated in FIG. 5, the sliding torsion springs 5 are disposed on the back surface of the first fixed plate 1. When the first fixed plate 1 is attached to the second fixed plate 4, the sliding torsion springs 5 are positioned in a gap between the first fixed plate 1 and the second fixed plate 4. Accordingly, the sliding torsion springs 5 are not visible from the outside of the slide unit mechanism 10A.

When the sliding plate 2 reaches a middle position between the closed position and the open position, the direction of the force applied by the sliding torsion springs 5 to the sliding plate 2 is reversed. That is, when the sliding plate 2 is being slid from the closed position toward the open position, the sliding torsion springs 5 bias the sliding plate 2 toward the closed position while the sliding plate 2 is located between the closed position and the middle position and bias the sliding plate 2 toward the open position after the sliding plate 2 passes the middle position. Meanwhile, when the sliding plate 2 is being slid from the open position toward the closed position, the sliding torsion springs 5 bias the sliding plate 2 toward the open position while the sliding plate 2 is located between the open position and the middle position and bias the sliding plate 2 toward the closed position after the sliding plate 2 passes the middle position. Thus, the slide unit mechanism 10A is configured as a semi-automatic sliding mechanism.

In FIGS. 1A, 1C, and 2-5, a reference number 12 indicates an FPC hole. When the slide unit mechanism 10A is incorporated in an electronic apparatus, a flexible printed circuit (FPC) board is put through the FPC hole 12 to electrically connect a lower housing and an upper housing of the electronic apparatus.

Figure 6:
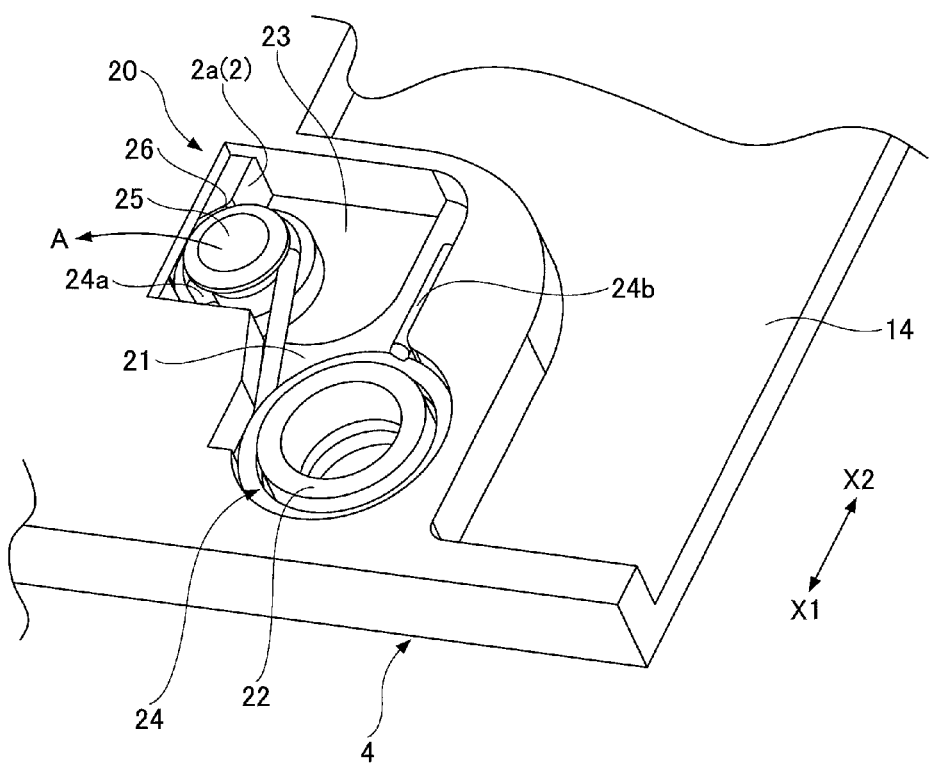
FIG. 6 is an enlarged perspective view of a rattle preventing mechanism of a slide unit mechanism according to the first embodiment.

Next, the rattle preventing mechanisms 20 are described with reference to FIGS. 5 and 6 in addition to FIGS. 1 through 4.

Each of the rattle preventing mechanisms 20 includes a recess 21, an opening 23, a locking torsion spring 24, an engaging part 25, and an engaging recess 26. The rattle preventing mechanisms 20 prevent the sliding plate 2 from rattling when the sliding plate 2 is slid to the closed position.

The recess 21 is formed in the back surface of the second fixed plate 4 near the closed position of the sliding plate 2. The locking torsion spring 24 and the engaging part 25 are placed in the recess 21. Accordingly, the locking torsion spring 24 and the engaging part 25 do not protrude from the back surface of the second fixed plate 4. That is, the rattle preventing mechanisms 20 do not increase the thickness of the slide unit mechanism 10A.

A spring mounting boss 22 for mounting the locking torsion spring 24 is formed in the recess 21. The spring mounting boss 22 is formed as a monolithic part of the second fixed plate 4. The locking torsion spring 24 is placed in the recess 21 such that the spring mounting boss 22 is inserted in the opening of the winding part of the locking torsion spring 24.

The opening 23 is also formed in the recess 21. The opening 23 passes through the second fixed plate 4 from the back surface to the front surface. As described above, the sliding plate 2 is slidably attached to the first fixed plate 1 and the first fixed plate 1 is attached to the second fixed plate 4. The position of the opening 23 on the front surface of the second fixed plate 4 is on the moving path of the slide part 2a. More specifically, the opening 23 is positioned to face the slide part 2a of the sliding plate 2 when the sliding plate 2 is at the closed position.

The engaging part 25 is attached to an end 24a of the locking torsion spring 24. Another end 24b of the locking torsion spring 24 is disposed to contact the inner wall of the recess 21. The engaging part 25 is shaped like a roller and made of resin. For example, the engaging part 25 may be made of polyacetal (POM) that is a type of engineering plastic with excellent shock resistance and sliding characteristics.

When the rattle preventing mechanism 20 is assembled on the second fixed plate 4, the engaging part 25 protrudes from the opening 23 on the front surface of the second fixed plate 4. With this configuration, the engaging part 25 is positioned on the moving path of the slide part 2a and engages the slide part 2a of the sliding plate 2 when the sliding plate 2 is slid to the closed position. The engaging part 25 is biased outward (in the direction indicated by an arrow A in FIG. 6) by the elastic force of the locking torsion spring 24.

The engaging recess 26 is formed in the slide part 2a of the sliding plate 2. The engaging recess 26 has a shape that matches the shape of the engaging part 25. The engaging recess 26 is formed at a side of the slide part 2a so as to face the engaging part 25 when the sliding plate 2 is moved to the closed position. When the sliding plate 2 is slid to the closed position, the engaging part 25 engages the engaging recess 26 of the slide part 2a and is pressed against the engaging recess 26 by the elastic force of the locking torsion spring 24.

In the present embodiment, two rattle preventing mechanisms 20 are provided across the sliding plate 2 at the closed position. Therefore, the sliding plate 2 is pressed from two sides by the engaging parts 25 that are biased by the elastic force of the locking torsion springs 24. In other words, the sliding plate 2 is sandwiched between a pair of rattle preventing mechanisms 20. Also, since the engaging parts 25 engage the engaging recesses 26, movement of the sliding plate 2 in the sliding direction (the X1 and X2 directions) is restricted. Thus, the rattle preventing mechanisms 20 make it possible to reliably prevent the sliding plate 2 at the closed position from rattling.

With the configuration where the width W of the sliding plate 2 is reduced to increase the stroke length of the sliding plate 2, the width of the slide parts 2a that engage the edge parts 8 is also reduced and the sliding plate 2 tend to rattle. In the slide unit mechanism 10A of the present embodiment, however, the rattling of the sliding plate 2 at the closed position is prevented by the rattle preventing mechanisms 20 even when the width of the sliding plate 2 is short.

Also, when the sliding plate 2 is slid from the open position to the closed position, the engaging part 25 engages the engaging recess 26 and thereby produces a "click" feel. The user of the slide unit mechanism 10A can recognize that the sliding plate 2 has reached the closed position based on this "click" feel.

Next, slide unit mechanisms 10B and 10C according to second and third embodiments are described with reference to FIGS. 7 and 8. The same reference numbers as those used for the components of the slide unit mechanism 10A described with reference to FIGS. 1 through 6 are also used for the corresponding components in FIGS. 7 and 8, and the descriptions of those components are omitted here.

Figure 7:
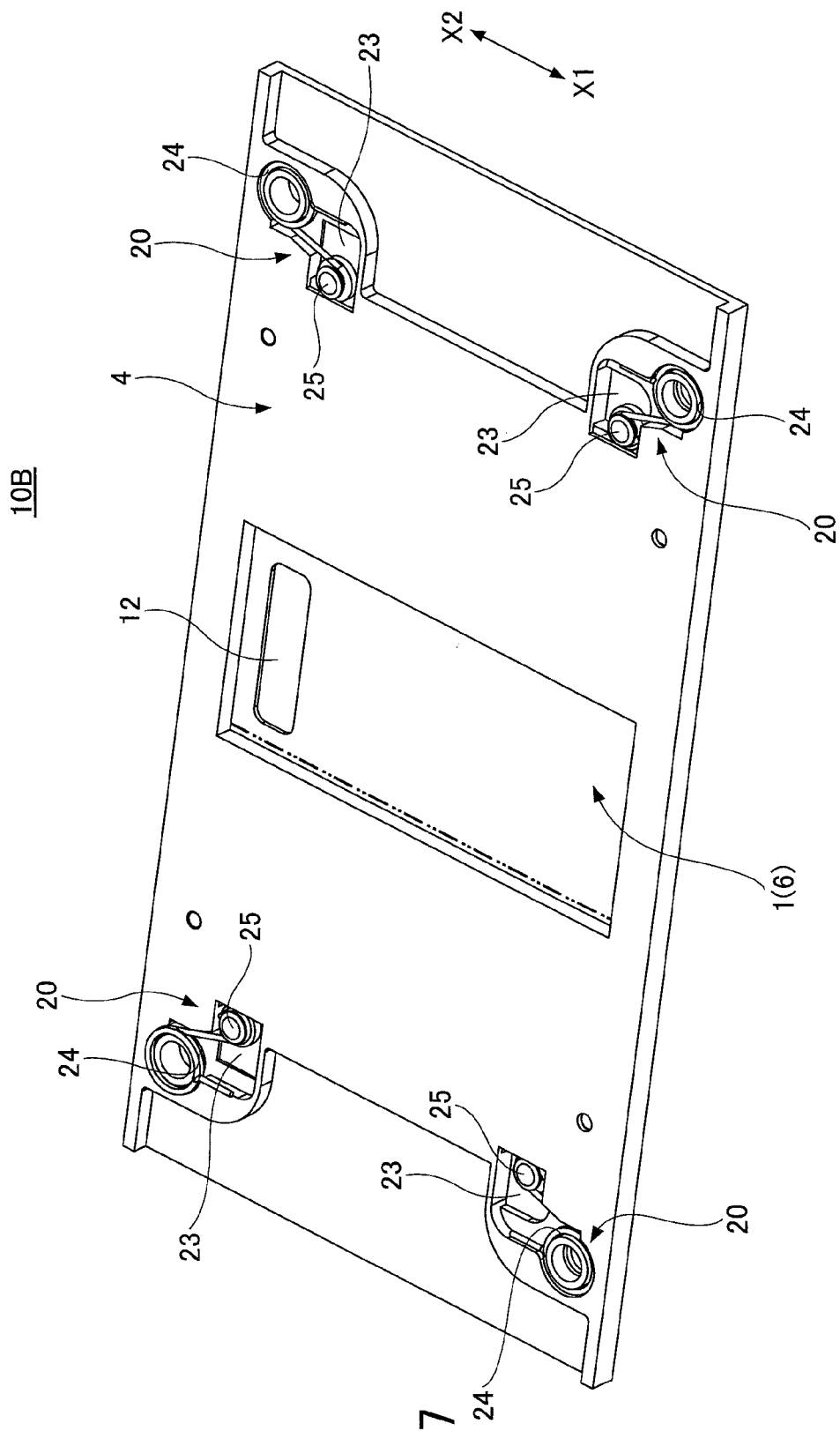
FIG. 7 is a drawing illustrating a slide unit mechanism according to a second embodiment.

FIG. 7 illustrates a slide unit mechanism 10B according to a second embodiment. As described above, the slide unit mechanism 10A of the first embodiment includes the rattle preventing mechanisms 20 that are disposed at the closed position of the sliding plate 2 to prevent the sliding plate 2 at the closed position from rattling.

As illustrated in FIG. 7, the slide unit mechanism 10B of the second embodiment includes rattle preventing mechanisms 20 at both the closed position and the open position of the sliding plate 2. This configuration makes it possible to prevent the sliding plate 2 from rattling at both the closed position and the open position. Also, although not shown, the rattle preventing mechanisms 20 may be provided only at the open position.

Figure 8:
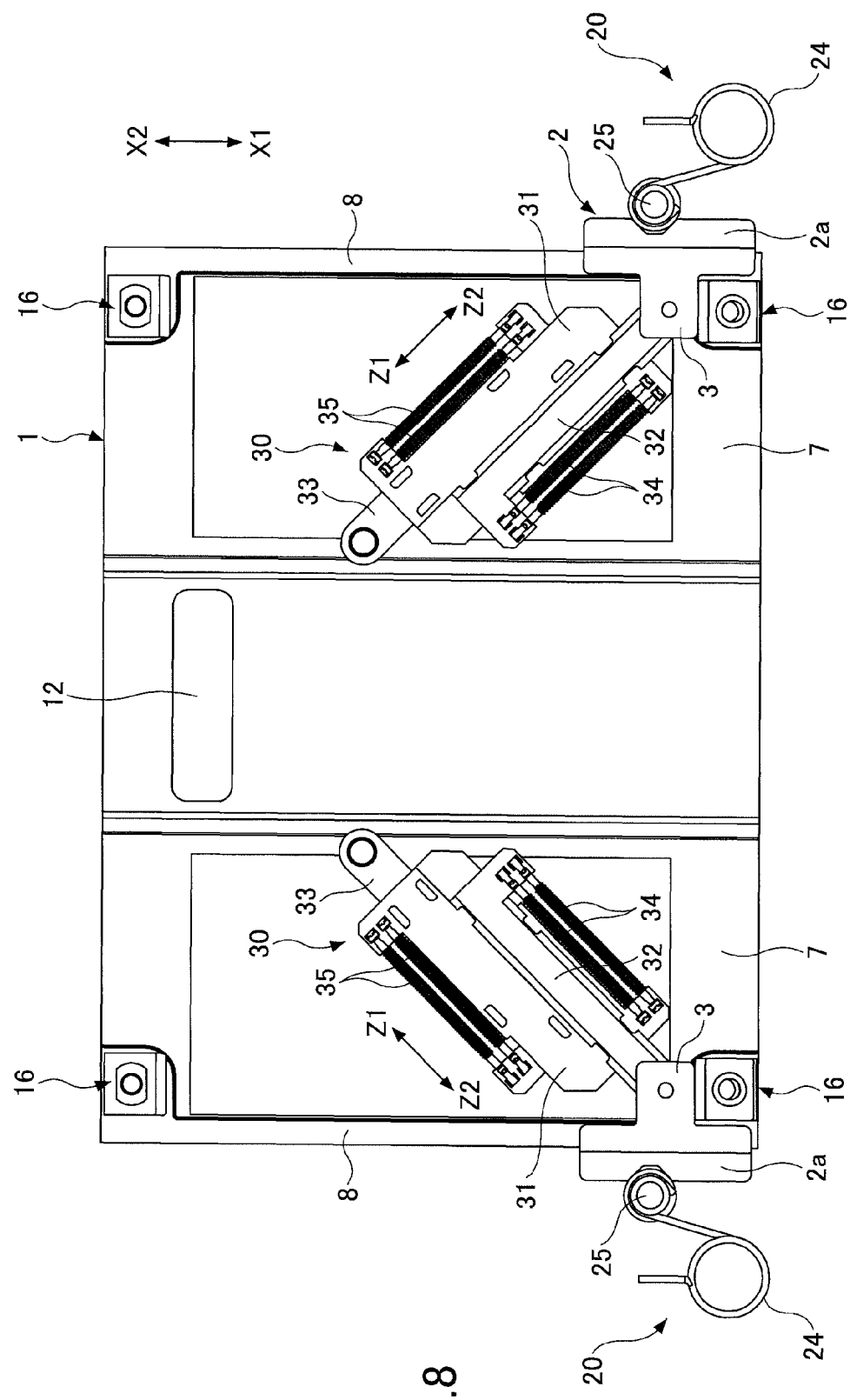
FIG. 8 is a drawing illustrating a slide unit mechanism according to a third embodiment.

FIG. 8 illustrates a first fixed plate 1 of a slide unit mechanism according to a third embodiment. In the slide unit mechanism 10A of the first embodiment, the sliding torsion springs 5 are used as sliding springs. In the third embodiment, spring units 30 are used as sliding springs. Similarly to the sliding torsion springs 5, the spring units 30 are disposed in the recesses 7 formed on the right and left sides of the first fixed plate 1.

Each of the spring units 30 includes a middle part 31, a first slide part 32, a second slide part 33, first tension springs 34, and second tension springs 35.

The first and second slide parts 32 and 33 are attached to the middle part 31 so as to be able to slide in the directions indicated by arrows Z1 and Z2 in FIG. 8. The first tension springs 34 are extended between the first slide part 32 and the middle part, and the second tension springs 35 are extended between the second slide part 33 and the middle part 31.

With this configuration, when the first slide part 32 is moved in the Z1 direction relative to the middle part 31, the first tension springs 34 are stretched and the first slide part 32 is biased in the Z2 direction by the elastic force of the first tension springs 34. Meanwhile, when the second slide part 33 is moved in the Z2 direction relative to the middle part 31, the second tension springs 35 are stretched and the second slide part 33 is biased in the Z2 direction by the elastic force of the second tension springs 35.

One end of the first slide part 32 is connected to the stopper 3 of the sliding plate 2, and one end of the second slide part 33 is connected to a boss (not shown) provided on the second fixed plate 4. Thus, also in the third embodiment, the spring units 30 are disposed between the first fixed plate 1 and the second fixed plate 4 and are not visible from the outside of the slide unit mechanism.

In FIG. 8, the sliding plate 2 is at the closed position. When the sliding plate 2 is slid from the closed position toward the open position (in the X2 direction), the spring unit 30 is caused to contract, the first slide part 32 is moved in the Z1 direction, and the second slide part 33 is moved in the Z2 direction. As a result, the first tension springs 34 and the second tension springs 35 are stretched, the first slide part 32 is biased in the Z2 direction, and the second slide part 33 is biased in the Z1 direction. Thus, the spring units 30 provide substantially the same functions as the sliding torsion springs 5 of the first embodiment, and the slide unit mechanism of the third embodiment is also configured as a semi-automatic sliding mechanism.

Since the spring units 30 can be made thinner than the sliding torsion springs 5 of the first embodiment, the third embodiment makes it possible to reduce the thickness of the sliding unit mechanism.

According to the above embodiments, when a sliding plate of a slide unit mechanism is at an open position or a closed position, an engaging part of a rattle preventing mechanism engages an engaging recess formed in the sliding plate, and the engaging part is biased by elastic force of a locking torsion spring toward the engaging recess. This configuration makes it possible to prevent the sliding plate from rattling.

Also according to the above embodiments, the locking torsion spring and the engaging part constituting the rattle preventing mechanism are placed in a recess formed in a second fixed plate. This configuration makes it possible to reduce the thickness of the slide unit mechanism and to reduce the area of the slide unit mechanism that is exposed.

Preferred embodiments of the present invention are described above. However, the present invention is not limited to the specifically disclosed embodiments, and variations and modifications may be made without departing from the scope of the present invention.

The present international application claims priority from Japanese Patent Application No. 2010-129706 filed on Jun. 7, 2010, the entire contents of which are hereby incorporated herein by reference.

EXPLANATION OF REFERENCES 10A, 10B Slide unit mechanism
1 First fixed plate
2 Sliding plate
2a Slide part
2b Connecting part
3 Stopper
4 Second fixed plate
5 Sliding torsion spring
8 Edge part
15 Mounting recess
20 Rattle preventing mechanism
21 Recess
22 Spring mounting boss
23 Opening
24 Locking torsion spring
25 Engaging part
26 Engaging recess
30 Spring unit

The invention claimed is:

1. A slide unit mechanism, comprising:
a quadrangular first fixed plate including a protrusion formed in a middle of a back surface thereof along a sliding direction and recesses formed on sides of the protrusion, one recess being formed on each side of the protrusion;
a sliding plate configured to slide on the first fixed plate between an open position and a closed position, the sliding plate including slide parts that slidably engage edges of the first fixed plate and a connecting part that connects the slide parts on a front surface of the first fixed plate;
a second fixed plate having a size greater than the first fixed plate, wherein the first fixed plate is attached to the second fixed plate;
sliding springs disposed in the recesses and between the first fixed plate and the second fixed plate, first ends of the sliding springs being held at positions substantially in a middle of the first fixed plate in the sliding direction and second ends of the sliding springs being held by the slide parts; and
rattle preventing mechanisms configured to engage the sliding plate when the sliding plate is slid to at least one of the open position and the closed position to thereby prevent the sliding plate from rattling,
wherein each of the rattle preventing mechanisms includes:
a recess formed in a back surface of the second fixed plate at a position corresponding to one of the open position and the closed position of the sliding plate,
an opening that passes through the second fixed plate from the recess to a front surface of the second fixed plate and is positioned on a moving path of one of the slide parts,
a locking torsion spring disposed in the recess, one end of the locking torsion spring engaging the second fixed plate and another end of the locking torsion spring being attached to an engaging part that protrudes from the opening on the moving path of the one of the slide parts, and
an engaging recess formed in the one of the slide parts and configured to engage the engaging part;
wherein the engaging part is configured to engage the engaging recess and to be biased by elastic force of the locking torsion spring toward the engaging recess when the sliding plate is slid to the open position or the closed position.

2. The slide unit mechanism as claimed in claim 1, wherein the slide parts and the engaging parts comprise resin.

* * * * *